United States Patent
Balasubramanian

(10) Patent No.: US 10,979,102 B2
(45) Date of Patent: Apr. 13, 2021

(54) NEAR FIELD COMMUNICATION DEVICE WITH VOLTAGE REGULATION COMPRISING AN INTEGRAL CONTROLLER AND A VARIABLE SHUNT RESISTANCE

(71) Applicant: Nordic Semiconductor ASA, Trondheim (NO)

(72) Inventor: Shankkar Balasubramanian, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

(21) Appl. No.: 16/465,122

(22) PCT Filed: Nov. 29, 2017

(86) PCT No.: PCT/GB2017/053602
§ 371 (c)(1),
(2) Date: May 29, 2019

(87) PCT Pub. No.: WO2018/100369
PCT Pub. Date: Jun. 7, 2018

(65) Prior Publication Data
US 2019/0326956 A1 Oct. 24, 2019

(30) Foreign Application Priority Data

Nov. 30, 2016 (GB) ...................................... 1620355

(51) Int. Cl.
*H04B 5/00* (2006.01)
*H04B 17/30* (2015.01)
(Continued)

(52) U.S. Cl.
CPC ........... *H04B 5/0081* (2013.01); *G05F 1/461* (2013.01); *H03K 5/24* (2013.01); *H04B 5/0031* (2013.01); *H04B 17/30* (2015.01)

(58) Field of Classification Search
CPC .... H04B 5/0081; H04B 17/30; H04B 5/0031; H04B 1/1036; H04B 1/123; H04B 5/00;
(Continued)

(56) References Cited

U.S. PATENT DOCUMENTS 8,853,892 B2 * 10/2014 Fells ....................... H02J 5/005
307/104
9,236,915 B2 * 1/2016 Fonseca ............... H04B 5/0075
(Continued)

FOREIGN PATENT DOCUMENTS

EP          2675077 A2    12/2013
EP          2930647 A1    10/2015
WO    WO 2009/063214 A1    5/2009

OTHER PUBLICATIONS

International Search Report and Written Opinion for PCT/GB2017/053602, dated Feb. 21, 2018, 20 pages.
(Continued)

*Primary Examiner* — Pablo N Tran
(74) *Attorney, Agent, or Firm* — Klarquist Sparkman, LLP

(57) ABSTRACT

An electronic device is arranged to receive near-field communication signals and comprises: first and second antenna connection terminals and a variable shunt resistance connected between the first and second antenna connection terminals. The device further comprises a peak detector arranged to detect an amplitude of an incoming near-field communication signal across the antenna connection terminals and to produce a peak signal (Vpd) dependent on the amplitude and a comparator arranged to produce an error signal, wherein the error signal is dependent on a difference
(Continued)

between the peak signal and a reference signal (Vrefpeak). The device also comprises an integral controller which is arranged to vary the shunt resistance in response to an integral of the error signal. Said configuration is employed for regulating the received voltage and reducing voltage swing.

15 Claims, 8 Drawing Sheets

(51) Int. Cl.
*G05F 1/61* (2006.01)
*G05F 1/46* (2006.01)
*H03K 5/24* (2006.01)

(58) Field of Classification Search
CPC ......... H04B 17/00; G05F 1/461; G05F 1/613; H03K 5/24; H02M 7/217; H04W 72/0446; G06K 7/0008; G06K 7/00
See application file for complete search history.

(56) References Cited

U.S. PATENT DOCUMENTS

| | | | |
|---|---|---|---|
| 9,479,013 B2* | 10/2016 | Joye | H04B 5/0031 |
| 9,762,292 B2* | 9/2017 | Manian | H04B 5/0037 |
| 10,128,862 B2* | 11/2018 | Liu | H03M 1/1009 |
| 10,511,347 B2* | 12/2019 | Hueber | H03B 5/06 |
| 2009/0011706 A1* | 1/2009 | Wilson | H04B 5/02 |
| | | | 455/41.1 |
| 2010/0291869 A1 | 11/2010 | Wilson | |
| 2011/0080152 A1* | 4/2011 | Luzzi | G06K 19/0723 |
| | | | 323/299 |
| 2013/0057242 A1 | 3/2013 | Zambetti et al. | |
| 2013/0344805 A1* | 12/2013 | Lefley | H04B 5/0031 |
| | | | 455/41.1 |
| 2015/0091385 A1 | 4/2015 | Manian et al. | |
| 2016/0103460 A1 | 4/2016 | Agrawal et al. | |
| 2016/0165386 A1 | 6/2016 | Agrawal et al. | |

OTHER PUBLICATIONS

Search Report under Section 17(5) for GB1620355.6, dated Jul. 21, 2017, 4 pages.

* cited by examiner

NEAR FIELD COMMUNICATION DEVICE WITH VOLTAGE REGULATION COMPRISING AN INTEGRAL CONTROLLER AND A VARIABLE SHUNT RESISTANCE

CROSS REFERENCE TO RELATED APPLICATIONS

This is the U.S. National Stage of International Application No. PCT/GB2017/053602, filed Nov. 29, 2017, which was published in English under PCT Article 21(2), which in turn claims the benefit of Great Britain Application No. 1620355.6, filed Nov. 30, 2016.

The present invention relates to near field communication (NFC), particularly to regulating the voltage swing across the antenna of an NFC receiver.

Near field communication (NFC) provides a method of short range communication between devices when they are brought into close proximity to one another, usually of the order of ten centimetres or less. An NFC-capable device normally comprises a small loop antenna connected to an integrated circuit within the device and provides the device with the capability to communicate over short ranges using magnetic induction. NFC connectivity has become increasingly popular in recent times in mobile devices for short range communication.

Typically NFC communications are between a transmitter or "poller" device and a receiver or "listener" device, at least one of which is usually portable. When they are in operative range, the poller and listener devices are located within each other's respective electromagnetic near field regions, such that the two devices form an air-core transformer due to their mutual inductance. The poller device applies an alternating voltage across its loop antenna which establishes a magnetic field that is received by the listener device and converted back to a voltage. NFC communications usually employ the unlicensed radio frequency industrial, scientific and medical (ISM) band of 13.56 MHz and are modulated using one of a number of techniques known in the art such as amplitude shift keying (ASK) wherein the voltage level may alternate between a minimum and a maximum voltage level to represent a digital 0 and 1 respectively.

As long as the listener device is sufficiently close to the poller device, the listener should receive communications sent by the poller. However, the range of voltages or "voltage swing" across the loop antenna of the listener can vary dramatically depending on a number of factors such as the distance between the poller and the listener, the strength of the field established by the poller, and the mutual inductance between the two devices. It is important to regulate the voltage swing across the loop antenna of the listener in order to ensure that the voltage swing is not too small such that the incoming signals cannot be demodulated effectively but also not too large such that the circuitry could be damaged.

Some known NFC receivers utilise a digital feedback loop to control the voltage swing across the NFC loop antenna, however the Applicant has appreciated that this does not allow for optimal control due to the quantised nature of digital control (i.e. only a finite set of voltage swings can be represented digitally). Furthermore, quantisation error is highly dependent on the value of the supply voltage. Other NFC receivers known in the art per se utilise proportional analogue control which provides more accurate control over the full voltage range when compared to digital control. However, the Applicant has further recognised that utilising proportional analogue control instead of digital control also has a number of associated drawbacks, particularly that the gain of a typical error amplifier in such a proportional analogue feedback loop increases the quality factor or "Q-factor" during a "low phase" of the received signal (i.e. when the voltage is at its minimum) which reduces the demodulation capabilities of the receiver.

When viewed from a first aspect, the present invention provides an electronic device arranged to receive near-field communication signals, the electronic device comprising:
first and second antenna connection terminals;
a variable shunt resistance connected between said first and second antenna connection terminals;
a peak detector arranged to detect an amplitude of an incoming near-field communication signal across said antenna connection terminals and to produce a peak signal dependent on said amplitude;
a comparator arranged to produce an error signal, wherein the error signal is dependent on a difference between the peak signal and a reference signal; and
an integral controller arranged to vary the shunt resistance in response to an integral of the error signal.

In use the device would have an antenna connected across the first and second antenna connection terminals.

The invention extends to a near-field communications device comprising an antenna, said device being arranged to:
receive an incoming near-field communications signal at said antenna;
detect an amplitude of said incoming near-field communication signal;
produce a peak signal dependent on said amplitude;
produce an error signal, wherein the error signal is dependent on a difference between the peak signal and a reference signal; and
vary a variable shunt resistance connected across said antenna in response to an integral of the error signal.

The invention further extends to a method of operating a near-field communications device comprising an antenna, said method comprising:
receiving an incoming near-field communications signal at said antenna;
detecting an amplitude of said incoming near-field communication signal;
producing a peak signal dependent on said amplitude;
producing an error signal, wherein the error signal is dependent on a difference between the peak signal and a reference signal; and
varying a variable shunt resistance connected across said antenna in response to an integral of the error signal.

Thus it will be appreciated by those skilled in the art that in accordance with at least preferred embodiments of the present invention, a receiver device has a variable shunt resistance connected in parallel to the antenna connection that is varied in response to an accumulated error between the voltage swing (i.e. the amplitude of the incoming NFC signal) and a desired level. The voltage swing can be increased by increasing the shunt resistance or decreased by decreasing the shunt resistance.

While it will be appreciated by those skilled in the art that error signal could be a voltage, in some embodiments the error signal comprises a current proportional to the difference in the voltage of the peak signal and the voltage of the reference signal. In some such embodiments, the integral controller comprises a differential amplifier and a capacitor, wherein the capacitor provides feedback to the differential amplifier. It will be appreciated by those skilled in the art that an integral controller arranged in this manner produces an output voltage proportional to the integral of a current at its input.

Incoming NFC signals received by an antenna connected across the input terminals will typically fluctuate around an average or "common mode" voltage. In some embodiments, the device comprises a common mode circuit portion connected in parallel to the variable shunt resistance, said common mode circuit portion being arranged to maintain a predetermined common mode voltage. Such arrangements advantageously ensure that the common mode voltage remains constant and, in preferred embodiments, centred at half of the supply voltage range in order to allow for maximum and equal voltage swing either side of the common mode voltage.

In some embodiments, the device comprises first and second DC blocking capacitors connected to each of the first and second input terminals. These DC blocking capacitors prevent any DC signals travelling to or from the antenna while still allowing any NFC signals (which are AC) to pass to the rest of the circuitry of the device.

While the integral controller may be connected directly to the variable shunt resistance, in some embodiments the integral controller is connected to the variable shunt resistance via a low-pass filter. Such a low-pass filter may act to prevent any high frequency components of the error signal from affecting the variable shunt resistance and also helps to isolate the output of the controller from unwanted signals due to the capacitance of the variable shunt resistance.

NFC listener devices such as tags, smart cards, etc. typically utilise a technique known as "load modulation" to transmit data back to the poller device. This technique involves varying a load impedance connected across the listener device's antenna such that the poller device "sees" a varying impedance at the input of the magnetically coupled listener device from which it can determine the data being communicated back. Accordingly, in some embodiments the device further comprises a load modulation variable shunt resistance connected between the first and second antenna connection terminals. It will be appreciated that, where provided, this secondary shunt resistance is connected in parallel with the variable shunt resistance described previously. In some such embodiments, the device comprises a digital controller arranged to vary the load modulation shunt resistance. It will be appreciated that in accordance with such embodiments, the load modulation shunt resistance is varied in order to convey digital 0's and 1's to the poller device, while the variable shunt resistance is used to regulate the voltage swing across the antenna connection terminals.

In some embodiments the shunt resistance comprises one or more field-effect-transistors (FETs). Where multiple FETs form the shunt resistance, two or more of these are typically arranged in parallel, though other topologies may be used. The integral controller may then, at least in some embodiments, vary a voltage applied to the gate terminal(s) of the one or more FETs in order to change the conductance thereof. That is to say, the integral controller can increase the conductance and thus decrease the shunt resistance and vice versa as required in order to vary the voltage swing.

In some such embodiments, the device comprises an analogue-to-digital converter (ADC) arranged to generate a digital control word from the integral of the error signal and use said digital control word to enable a selected one or more of the field-effect-transistors. This may provide the advantages of both analogue-based integral control and digital control. In such embodiments, rather than the output of the integral controller being connected to the variable shunt resistance (directly or, where appropriate, via a filter) the output of the integral controller is input to the ADC which converts the analogue output signal produced by the integral controller This is novel and inventive in its own right and thus when viewed from a second aspect, the present invention provides an electronic device arranged to receive near-field communication signals, the electronic device comprising:
first and second antenna connection terminals;
a variable shunt resistance connected between said first and second antenna connection terminals, said variable shunt resistance comprising one or more field-effect-transistors connected in parallel;
a peak detector arranged to detect an amplitude of an incoming near-field communication signal across said antenna connection terminals and to produce a peak signal dependent on said amplitude;
a comparator arranged to produce an error signal, wherein the error signal is dependent on a difference between the peak signal and a reference signal; and
an analogue-to-digital converter arranged to generate a digital control word from the error signal and use said digital control word to enable one or more of the field-effect-transistors.

In use the device comprises an antenna connected across the first and second antenna connection terminals.

The second aspect of the present invention extends to a near-field communications device comprising an antenna, said system being arranged to:
receive an incoming near-field communications signal at said antenna;
detect an amplitude of said incoming near-field communication signal;
produce a peak signal dependent on said amplitude;
produce an error signal, wherein the error signal is dependent on a difference between the peak signal and a reference signal;
generate a digital control word from the error signal and uses said digital control word to enable one or more field-effect-transistors connected across said antenna.

The second aspect of the present invention further extends to a method of operating a near-field communications device comprising an antenna, said method comprising:
receiving an incoming near-field communications signal at said antenna;
detecting an amplitude of said incoming near-field communication signal;
producing a peak signal dependent on said amplitude;
producing an error signal, wherein the error signal is dependent on a difference between the peak signal and a reference signal;
generating a digital control word from the error signal and uses said digital control word to enable one or more field-effect-transistors connected across said antenna.

The antenna may comprise a loop antenna.

It will be appreciated that the preferred and optional features described hereinabove in relation to the first aspect apply equally to the second aspect where appropriate. In particular in some embodiments the device further comprises a load modulation variable shunt resistance connected between the first and second antenna connection terminals. The load modulation shunt resistance could comprise a plurality of field effect transistors connected in parallel.

Certain embodiments of the invention will now be described, by way of example only, with reference to the accompanying drawings in which.

Figure 1A:
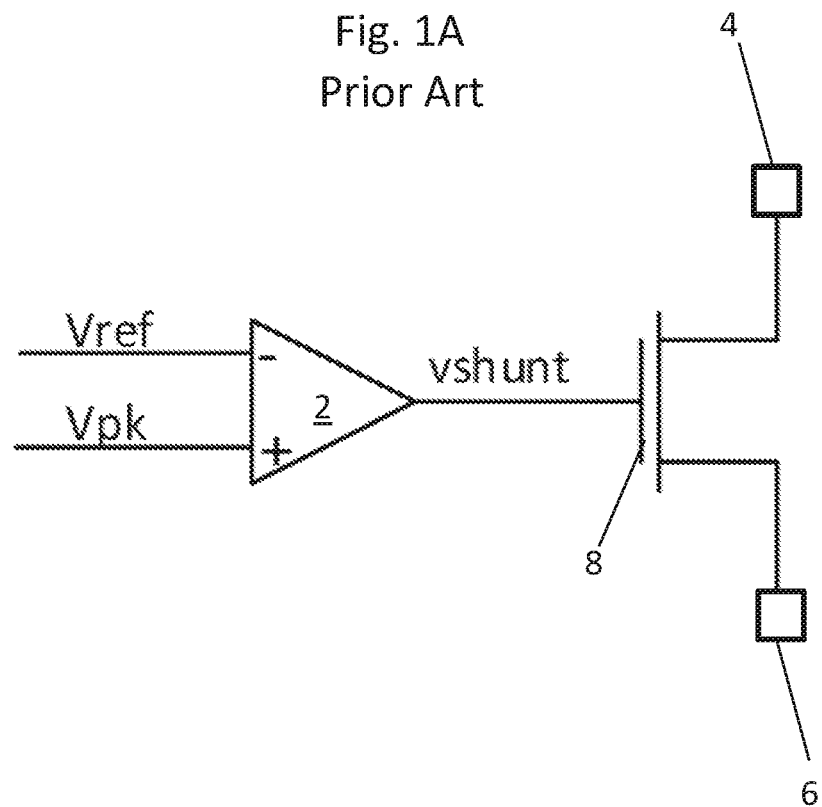
FIGS. 1A and 1B illustrate diagrammatically for reference only the principle of proportional control.
Figure 1B:
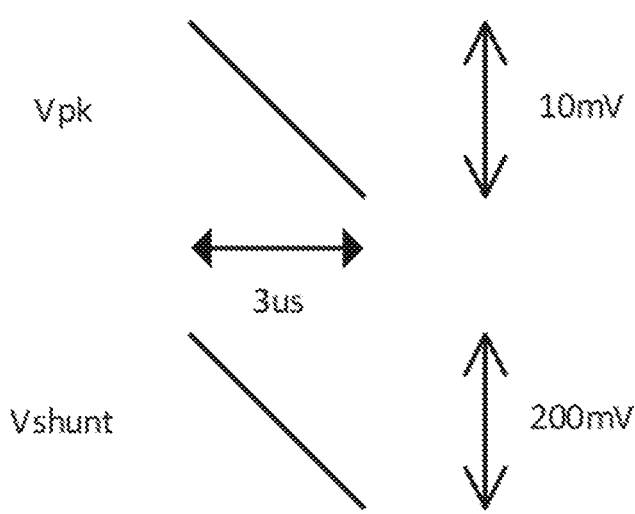

FIGS. 1A and 1B illustrate, for reference only, the principle of proportional control. A differential amplifier 2 is arranged to compare a voltage Vpk to a reference voltage Vref by having the voltage Vpk connected to the non-inverting input of the differential amplifier 2 and the reference voltage Vref connected to the inverting input of the differential amplifier 2. The voltage Vpk may correspond to the peak voltage of (i.e. the amplitude of) an incoming near-field communications (NFC) signal received at a loop antenna connected to a pair of antenna connection terminals 4, 6.

The differential amplifier 2 provides an output voltage Vshunt that is proportional to a difference between Vpk and Vref. This output voltage Vshunt is applied to the gate terminal of a field effect transistor (FET) 8 which has its respective source and drain terminals connected to the antenna connection terminals 4, 6 respectively.

If the voltage swing (i.e. the amplitude range) of an incoming NFC signal received across the antenna connection terminals 4, 6 is much greater than the reference voltage Vref, the differential amplifier 2 applies a large positive voltage Vshunt to the gate terminal of the transistor 8 which increases its conductance and thus reduces its resistance accordingly. As the loop antenna effectively forms the secondary coil of an air-core transformer with the antenna of an NFC poller device (where the poller device's loop antenna forms the primary coil), the current generated that flows through the antenna depends on the mutual inductance between the two NFC devices and so reducing the resistance connected across the antenna connection terminals 4, 6 as described above reduces the voltage swing.

FIG. 1B illustrates the behaviour of the output voltage Vshunt produced by the differential amplifier 2 under such proportional control in response to a steady decrease in the peak voltage Vpk. Over the course of 3 µs, Vpk is lineally reduced by 10 mV, which causes the output voltage Vshunt produced by the differential amplifier 2 to be reduced by 200 mV in response (i.e. the differential amplifier 2 has a gain of twenty).

Figure 2A:
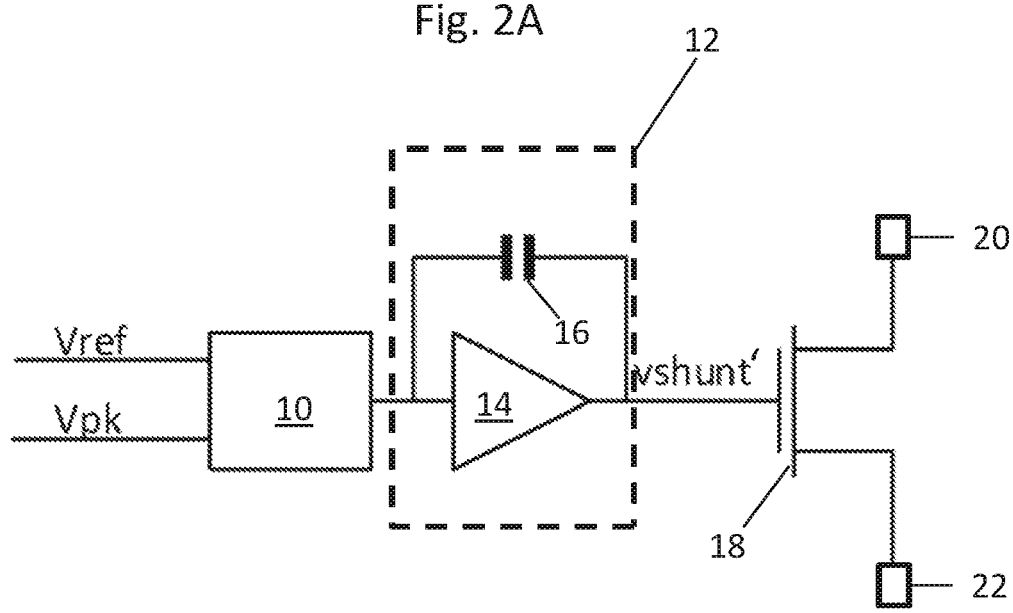
FIGS. 2A and 2B illustrate diagrammatically the principle of integral control.
Figure 2B:
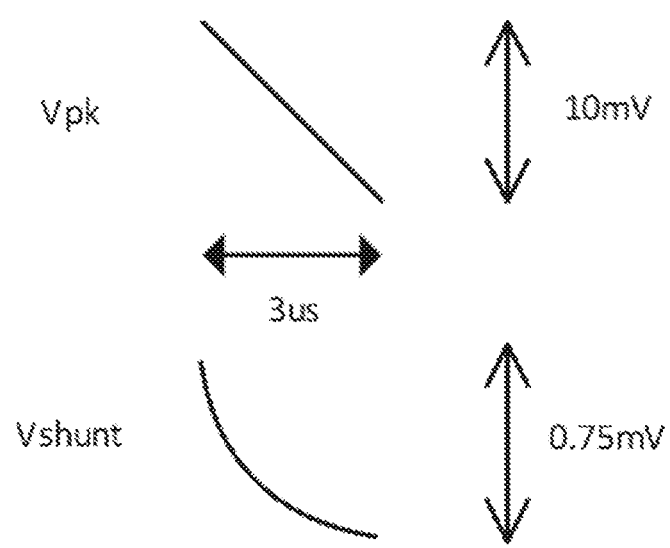

By way of contrast, FIGS. 2A and 2B illustrate integral control employed in accordance with the present invention. In this case a voltage-to-current converter 10 is arranged to produce an output current which is proportional to a difference between the peak voltage Vpk and the reference voltage Vref. This current is input to an integrator 12 comprising an operational amplifier (or "op-amp") 14 and a capacitor 16.

The integrator 12 is arranged to produce an output voltage Vshunt' proportional to the integral of the current produced by the voltage-to-current converter 10. This output voltage Vshunt' is applied to the gate terminal of a FET 18, which has its source and drain terminals connected to the first and second antenna connection terminals 20, 22.

FIG. 2B shows how the output voltage Vshunt' produced by the integrator 12 varies as the peak voltage Vpk drops steadily by 10 mV over the course of 3 µs. In this case, the output voltage Vshunt' produced by the integrator 12 does not drop linearly but instead exhibits parabolic behaviour due to the integrator 12, dropping by 0.75 mV over 3 µs.

Figure 3:
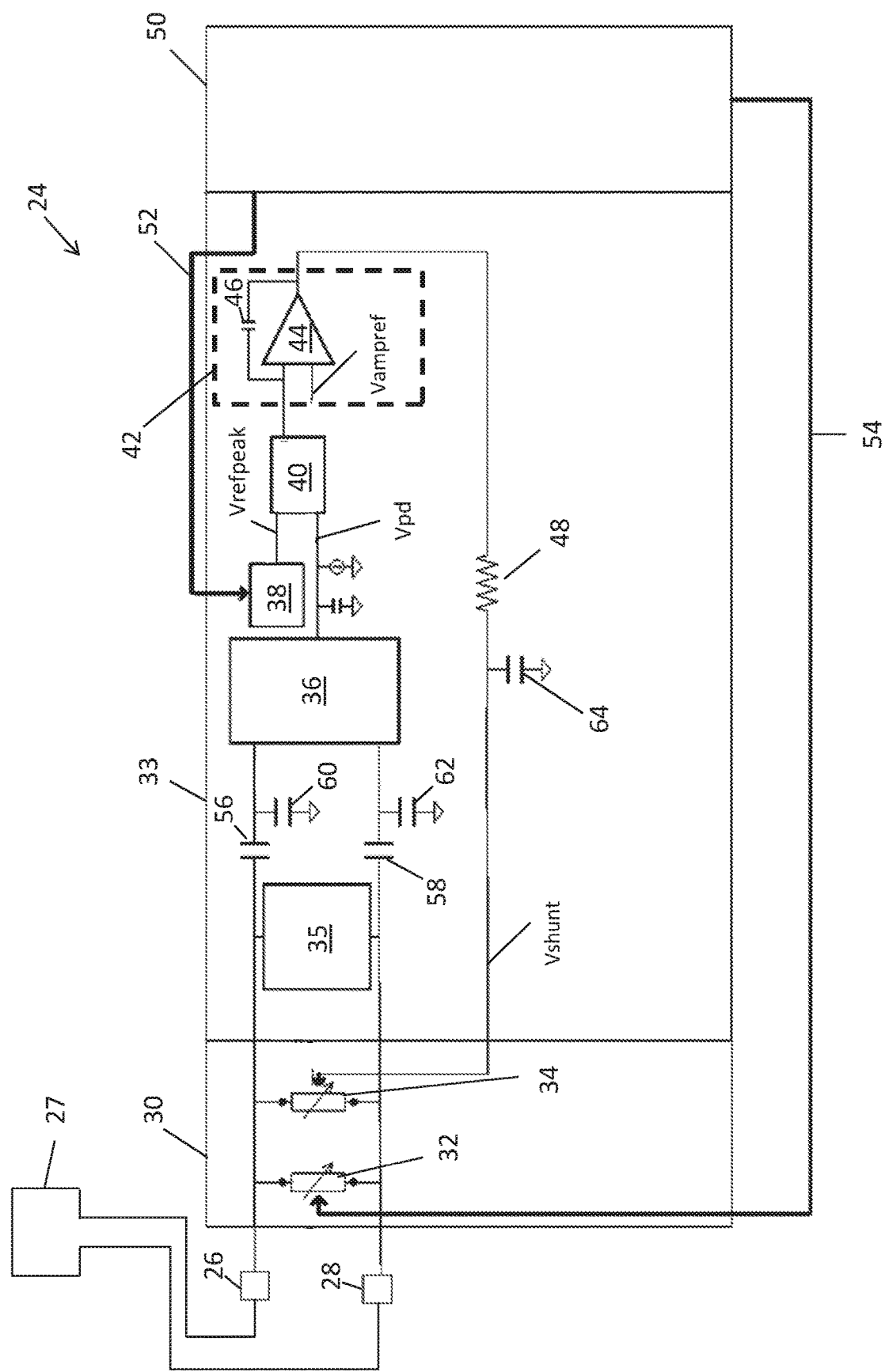
FIG. 3 is a circuit diagram of a near-field communications device in accordance with an embodiment of the present invention.

FIG. 3 is a circuit diagram of an NFC listener device 24 in accordance with an embodiment of the present invention. The NFC device 24 comprises first and second antenna connection terminals 26, 28 across which a loop antenna 27 is connected. The antenna connection terminals 26, 28 are connected to a pad circuit 30 which comprises a digitally controlled load 32 and an analogue controlled load 34. The digitally controlled load 32 and the analogue controlled load 34 are connected in parallel with one another and are connected between the first and second antenna connection terminals 26, 28. The analogue controlled load 34 is arranged to vary a voltage swing across the antenna connection terminals 26, 28 while the digitally controlled load 32 is arranged to provide load modulation in order to communicate data to an NFC poller device. The operation of each of these loads will be described in further detail below. The pad circuit 30 is connected to a shunt regulator circuit 33 which comprises: a common mode circuit 35; a peak detector circuit 36; a reference generator 38; a voltage-to-current converter 40; an integrator 42 constructed from a differential amplifier 44 and a feedback capacitor 46; and a resistor 48 which connects the output of the integrator 42 to the analogue controlled load 34.

The NFC device 24 also comprises a digital circuit 50 (depicted simply as a block) arranged to provide a control signal 52 to the reference generator 38. The digital circuit 50 is further arranged to provide a control signal 54 to the digitally controlled load 32.

The common mode circuit 35 maintains the common mode signal between the first and second antenna connection terminals 26, 28 at a predetermined value. In this particular embodiment, the common mode circuit 35 maintains the common mode at half of the supply voltage range, allowing for a symmetric voltage swing about the centre of the supply range (thus providing maximum range both above and below the common mode value).

The antenna connection terminals 26, 28 are connected to the peak detector 36 via DC blocking capacitors 56, 58 respectively. These DC blocking capacitors 56, 58 remove any DC components present within the incoming NFC signal, only allowing AC signal components to pass to the peak detector 36. Grounding capacitors 60, 62 provide a path to ground from the input terminals of the peak detector 36 for any AC signal components (i.e. no current flows into the peak detector 36 which simply detects the voltage at its inputs). The peak detector 36 is arranged to determine the peak voltage Vpd of the incoming signal received by the loop antenna 27 and presented at the antenna connection terminals 26, 28. The peak detector 36 produces an output voltage Vpd which is proportional to the peak voltage of the incoming NFC signal. This peak detection voltage Vpd is input to the voltage-to-current converter 40 which compares the peak detection voltage Vpd to a peak reference voltage Vrefpeak generated by the reference generator 38. The value of the peak reference voltage Vrefpeak is determined by the value of the control signal 52 provided by the digital circuit 50. The voltage-to-current converter 40 compares the peak detection voltage Vpd to the peak reference Vrefpeak and produces a current proportional to the difference between these voltages. This current is input to the integrator 42 as described with reference to FIG. 2A above and described in greater detail below.

The integrator comprises the op-amp 44 with its non-inverting input connected to an amplifier reference voltage Vampref and its inverting input connected the output of the voltage-to-current converter 40. A feedback capacitor 46 is connected from the output of the op-amp 44 to the inverting input. The integrator 42 is arranged such that it attempts to keep the voltages at the non-inverting and inverting inputs equal at all times. It achieves this by varying the output voltage such that the feedback current passed through the feedback capacitor 46 "cancels out" the output current produced by the voltage current converter 40 such that the currents at the node of the inverting input sum to zero in accordance with Kirchhoff's current law.

As the current through a capacitor is proportional to the time derivative of the voltage applied to the capacitor (i.e. $I_C(t)=dV_C/dt$, where $I_C(t)$ is the current through the capacitor, $V_C$ is the voltage across the capacitor, and t is time), it follows that the output voltage produced by the op-amp 44 will be proportional to the time integral of the current through the capacitor 46 and thus the current produced by the voltage-to-current converter 40. The output voltage $V_{shunt}$ produced by the op-amp 44 is applied to the analogue controlled load 34 via a low pass filter constructed from the resistor 48 and the filter capacitor 64. The controller of the analogue controlled load is described in further detail with reference to FIG. 4 below.

Figure 4:
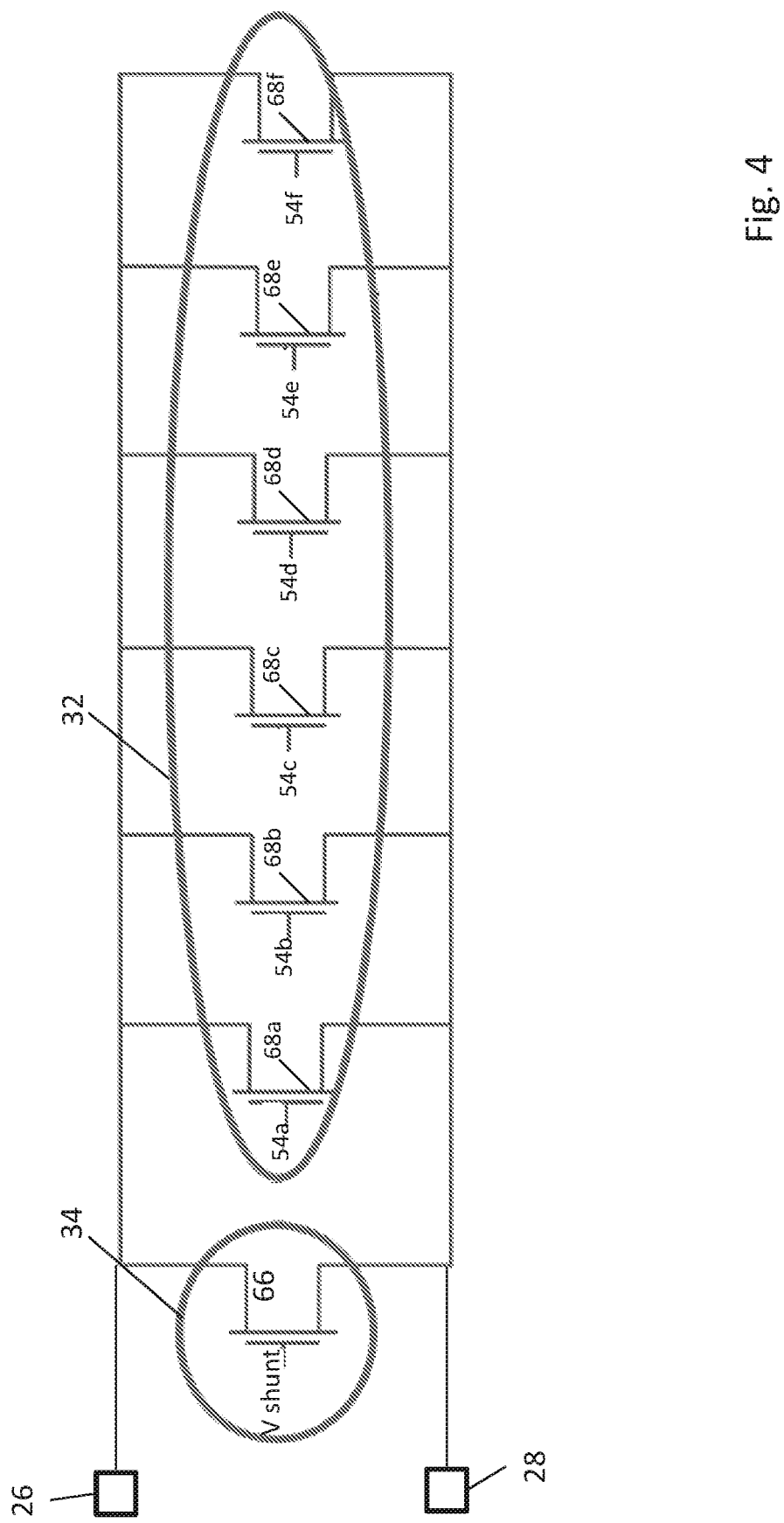
FIG. 4 is a circuit diagram of the analogue and digitally controlled loads of FIG. 3

FIG. 4 is a circuit diagram of the analogue controlled load 34 and the digitally controlled load 32 mentioned previously with reference to FIG. 3. As can be seen in FIG. 4, the output voltage Vshunt produced by the integrator 42 is applied to the gate terminal of a FET 66 connected between the first and second antenna connection terminals 26, 28. If the voltage swing associated with an incoming NFC signal is too low, the peak detector circuit 36 produces a relatively lower voltage Vpd which will result in a lower current being produced by the voltage-to-current converter 40. This will result in a smaller output voltage Vshunt being produced by the integrator 42 which reduces the conductance of the FET 66 (i.e. the analogue controlled load 34). As it will be appreciated, reducing the conductance of the FET 66 increases the resistance between the first and second antenna connection terminals 26, 28 (as conductance is the reciprocal of resistance). This will result in a higher voltage swing being obtained for further incoming NFC signals received across the antenna connection terminals 26, 28.

Similarly, the reverse is true if the voltage swing of an incoming NFC signal is too large. A large voltage swing across the antenna connection terminals 26, 28 will result in the peak detector circuit 36 producing a relatively higher voltage Vpd which will result in a larger current being produced by the voltage-to-current converter 40. This larger current will result in the integrator 42 producing a larger output voltage Vshunt which, when applied to an analogue controlled load 34, will cause the resistance between the first and second antenna connection terminals 26, 28 to decrease on account of the increased conductance of the FET 66.

Also shown in FIG. 4 are a number of FETs 68*a-f* which are arranged in parallel and are connected between the first and second antenna connection terminals 26, 28. These FETs 68*a-f* form the digitally controlled load 32 that is controlled by the digital circuit 50 shown in FIG. 3. In this particular, non-limiting example, the digital control word 54 produced by the digital circuit 50 is six bits wide and is split up into constituent control signals 54*a-f* which are applied to the gate terminals of the FETs 68*a-f*. By changing the digital value of the digital control word 54 and thus setting the individual control signals 54*a-f* to binary 0's or 1's, the resistance across the antenna connection terminals 26, 28 can be varied. This varies the input impedance to the NFC device 24 as seen by an NFC poller device. Thus by varying its input impedance in this manner, the NFC device 24 can convey data to such an NFC poller device.

While the FETs 68*a-f* may all be identical, it is envisaged that in some arrangements the channel widths of successive FETs may be doubled such that the second FET 68*b* is twice as wide as the first FET 68*a*, the third FET 68*c* is twice as wide as the second FET 68*b*, etc. This may provide for finer tuning and/or a wider range of the impedance across the antenna connection terminals 26, 28. It will of course be appreciated that the various FETs may have a different mathematical relationship to each other.

Figure 5:
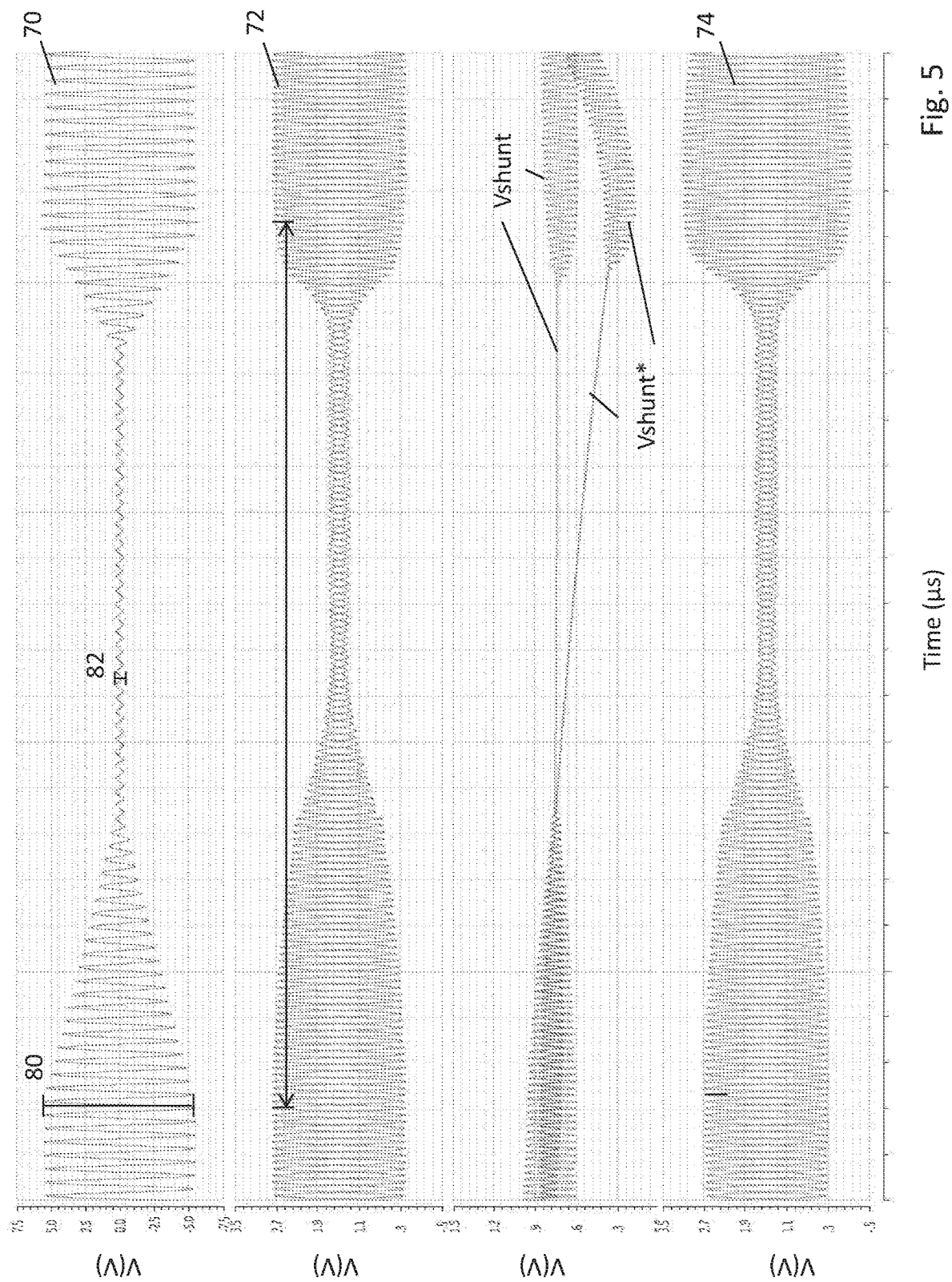
FIG. 5 is a graph comparing the behaviour of the device of FIG. 3 to a conventional near-field communications device with analogue proportional control.

FIG. 5 is a graph comparing the behaviour of the device 24 shown in FIG. 3 with a conventional NFC device that employs proportional control as described previously with reference to FIG. 1A. Shown in the uppermost graph of FIG. 5 is the voltage of the poller modulation signal 70 used by the NFC polling device. This poller modulation signal 70 is received by the NFC listener device 24 of FIG. 3 and the conventional NFC listener device producing the signals 72 and 74 across their respective antenna connection terminals. FIG. 5 also shows the voltage Vshunt applied to the gate terminals of the FETs within the analogue controlled loads of the integral control device 24 of FIG. 3 and the corresponding voltage Vshunt* for the conventional proportional control device.

As can be seen from the graph, when the poller modulation signal 70 drops from its high value 80 to its low value 82 (indicating a high-to-low transition in the data from a binary 1 to a binary 0), the voltage Vshunt in the device embodying the invention undergoes very little change (other than flattening out) whereas the corresponding voltage Vshunt* associated with the conventional proportional device changes much more significantly. The effect of this can be seen by comparing the values of the signals 72, 74 across the antenna connection terminals of the NFC devices. These follow the change in the poller modulation signal 70, albeit with a slight propagation and processing delay. However, when returning to the high value 80 the signal 72 across the antenna connection terminals 26, 28 of the device 24 in accordance with the present invention returns to substantially the same value that it had prior to the initial drop of the poller modulation signal 70. In contrast, the value of the signal 74 across the antenna connection terminals of the conventional proportional control device overshoots its initial value resulting in a larger voltage swing across the terminals than would be desirable.

Figure 6:
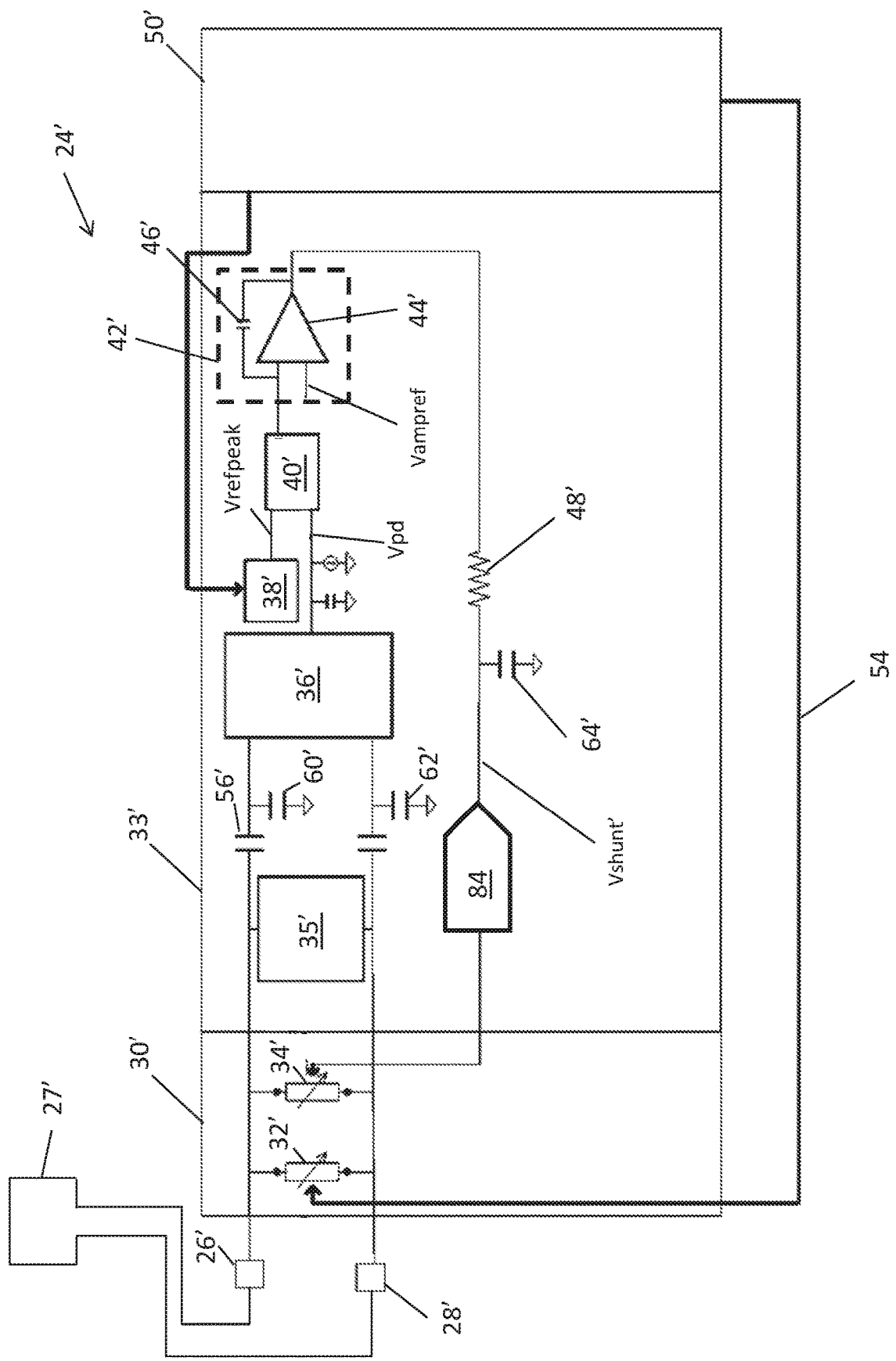
FIG. 6 is a circuit diagram of a near-field communications device in accordance with a further embodiment of the present invention.

FIG. 6 is a circuit diagram of a near-field communications listener device 24' in accordance with a further embodiment of the present invention. The structure of this device 24' is identical to that shown in FIG. 3 (with like reference numerals indicating equivalent components), with the exception of the addition of an analogue-to-digital converter (ADC) 84 between the resistor 48' and the analogue controlled load 34'. The ADC 84 samples the analogue output voltage Vshunt' provided by the integrator 42' and converts it to a digital signal which is supplied to the load 34'.

Figure 7:
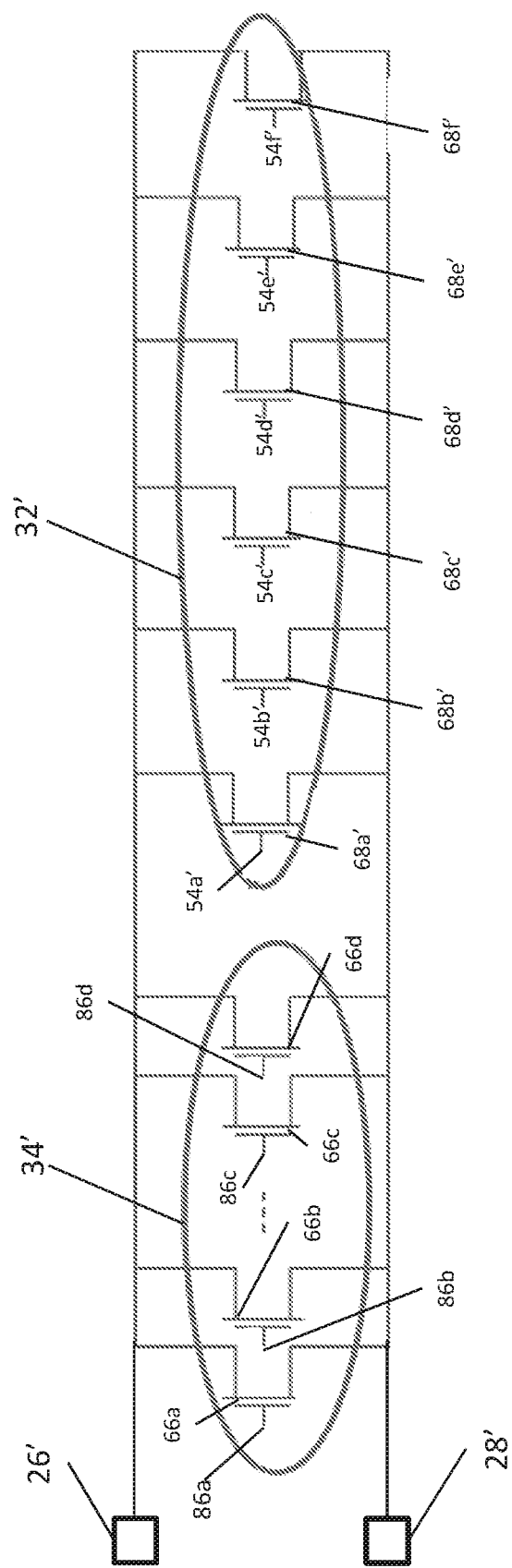
FIG. 7 is a circuit diagram of the analogue and digitally controlled loads of FIG. 6.

FIG. 7 is a circuit diagram of the analogue and digitally controlled loads of FIG. 6. While the digitally controlled load 32' remains unchanged compared to that shown in FIG. 4, the analogue controlled load 34' now also comprises a number of FETs 66a-d. The digital value produced by the ADC 84 is split into separate digital control signals 86a-d which are applied to the gate terminals of the FETs 66a-d respectively. It will be appreciated that while four FETs are shown here, typically there will be many more—e.g. there will be sixty-four FETS in the case of an 8-bit ADC. The device 24' of FIG. 6 combines the advantages of both integral analogue control and digital control as described further with reference to FIG. 8.

Figure 8:
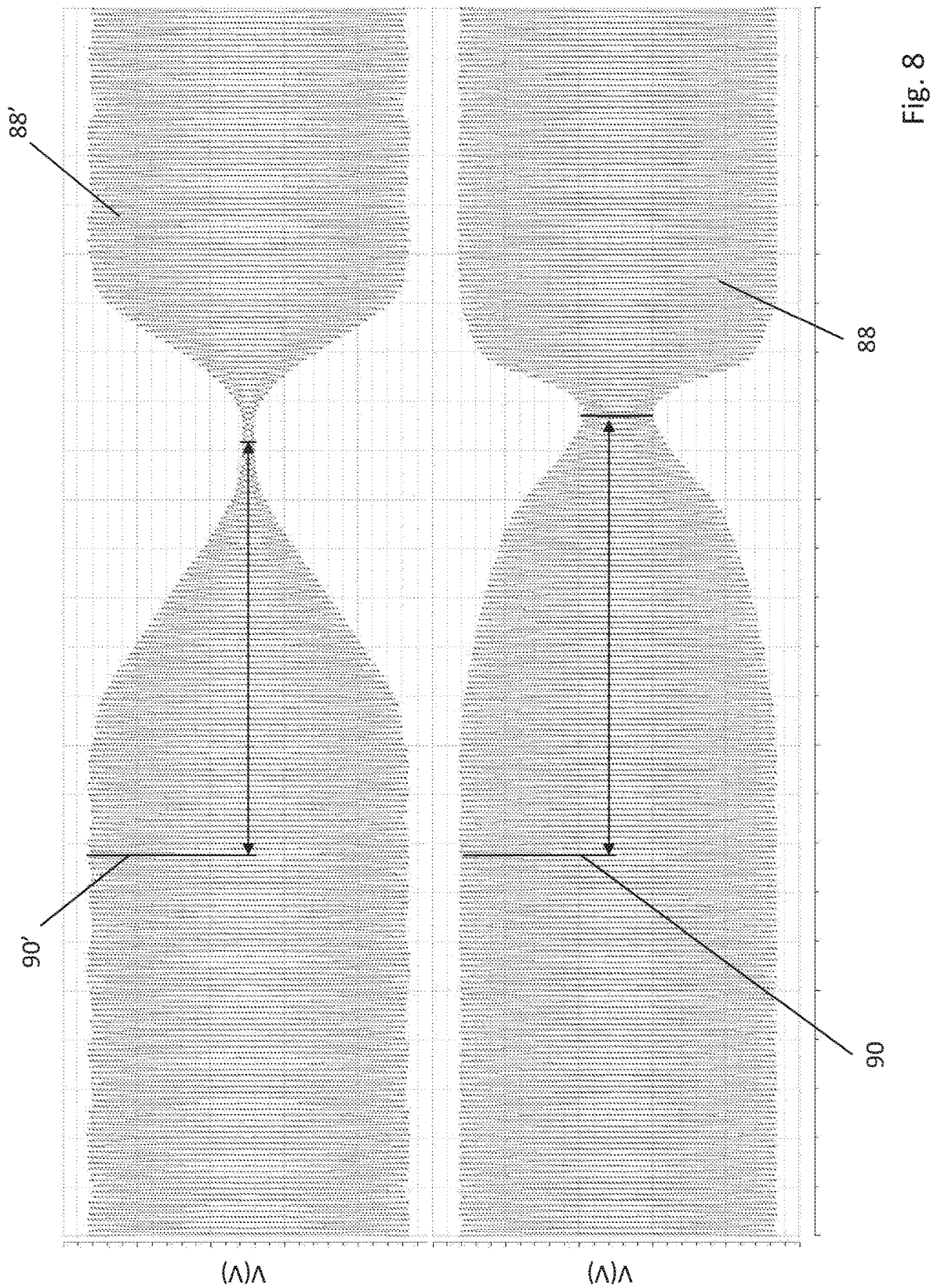
FIG. 8 is a graph comparing the demodulation behaviour of the devices of FIGS. 3 and 6.

FIG. 8 is a graph comparing the demodulation behaviour of the devices 24, 24' of FIGS. 3 and 6. Shown at the bottom of FIG. 8 is the output signal 88 produced by the NFC device 24 of FIG. 3. At the top of FIG. 8, the output signal 88' produced by the NFC device 24' of FIG. 6 is shown. It can be seen from these graphs that the difference 90' between the amplitudes of the high and low states of the output signal 88 produced by the device 24' of FIG. 6 is greater than the difference 90 between the high and low states of the output signal 88 produced by the device 24 of FIG. 3. This shows that the ADC 84 provides a greater difference 90' between the high and low states associated with binary 1's and 0's respectively which makes demodulation easier when compared to the signal 88 produced without the ADC 84.

Thus it will be seen that the described embodiments of the present invention provide an improved NFC receiver device that utilises integral control to maintain a desired voltage swing across the antenna connection terminals. It will be appreciated by those skilled in the art that the embodiments described herein above are merely exemplary and are not limiting on the scope of the invention.

The invention claimed is:

1. An electronic device arranged to receive near-field communication signals, the electronic device comprising:
    first and second antenna connection terminals;
    a variable shunt resistance connected between said first and second antenna connection terminals;
    a peak detector arranged to detect an amplitude of an incoming near-field communication signal across said antenna connection terminals and to produce a peak signal dependent on said amplitude;
    a comparator arranged to produce an error signal, wherein the error signal comprises a current proportional to a difference between the peak signal and a reference signal; and
    an integral controller, positioned between the comparator and the variable shunt resistance and arranged to generate an integral of the error signal and to vary the shunt resistance in response to the integral of the error signal, wherein the integral controller comprises a differential amplifier and a capacitor, and wherein the capacitor provides feedback to the differential amplifier.

2. The electronic device as claimed in claim 1, comprising a common mode circuit portion connected in parallel with the variable shunt resistance, said common mode circuit portion being arranged to maintain a predetermined common mode voltage.

3. The electronic device as claimed in claim 1, comprising first and second DC blocking capacitors connected to each of the first and second antenna connection terminals.

4. The electronic device as claimed in claim 1, wherein the integral controller is connected to the variable shunt resistance via a low-pass filter.

5. The electronic device as claimed in claim 1, comprising a load modulation variable shunt resistance connected between the first and second antenna connection terminals.

6. The electronic device as claimed in claim 5, further comprising a digital controller arranged to vary the load modulation shunt resistance.

7. The electronic device as claimed in claim 1, comprising an antenna connected across the first and second antenna connection terminals.

8. The electronic device as claimed in claim 1, wherein the shunt resistance comprises one or more field-effect-transistors.

9. The electronic device as claimed in claim 7, wherein the integral controller is arranged to vary a voltage applied to the gate terminal(s) of the one or more field-effect-transistors in order to change a conductance thereof.

10. A method of operating a near-field communications device comprising an antenna, said method comprising:
    receiving an incoming near-field communications signal at said antenna;
    detecting an amplitude of said incoming near-field communication signal;
    producing a peak signal dependent on said amplitude;
    producing an error signal, wherein the error signal comprises a current proportional to difference between the peak signal and a reference signal;
    generating an integral of the error signal using an integral controller which comprises a differential amplifier and a capacitor, the capacitor providing feedback to the differential amplifier; and
    varying a variable shunt resistance connected across said antenna in response to the integral of the error signal.

11. The method as claimed in claim 10, comprising maintaining a predetermined common mode voltage using a common mode circuit portion connected in parallel with the variable shunt resistance.

12. The method as claimed in claim 10, comprising varying a load modulation shunt resistance connected between the first and second antenna connection terminals.

13. The method as claimed in claim 12, comprising using a digital controller to vary the modulation shunt resistance.

14. The method as claimed in a claim 10, wherein the shunt resistance comprises one or more field-effect-transistors and the method further comprises varying a voltage applied to the gate terminal(s) of the one or more field-effect-transistors in order to change a conductance thereof.

15. A near-field communications device comprising an antenna, said device being arranged to:
    receive an incoming near-field communications signal at said antenna;
    detect an amplitude of said incoming near-field communication signal;
    produce a peak signal dependent on said amplitude;
    produce an error signal, wherein the error signal comprises a current proportional to a difference between the peak signal and a reference signal;
    generate an integral of the error signal using an integral controller which comprises a differential amplifier and a capacitor, wherein the capacitor provides feedback to the differential amplifier; and
    vary a variable shunt resistance connected across said antenna in response to the integral of the error signal.

* * * * *